(12) United States Patent
Abe (10) Patent No.: US 11,697,577 B2
(45) Date of Patent: Jul. 11, 2023

(54) ARTICLE LIFT DEVICE AND ARTICLE TRANSPORT VEHICLE PROVIDED WITH ARTICLE LIFT DEVICE

(71) Applicant: Daifuku Co., Ltd., Osaka (JP)

(72) Inventor: Takeshi Abe, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 149 days.

(21) Appl. No.: 17/496,294

(22) Filed: Oct. 7, 2021

(65) Prior Publication Data

US 2022/0112063 A1 Apr. 14, 2022

(30) Foreign Application Priority Data

Oct. 12, 2020 (JP) .................................. 2020-172122

(51) Int. Cl.
*B66F 19/00* (2006.01)
(52) U.S. Cl.
CPC .................................... *B66F 19/00* (2013.01)
(58) Field of Classification Search
CPC ......... B66C 13/00; B66C 13/04; B66C 13/06; B66C 13/10; B66F 19/00; H01L 21/6773; H01L 21/67733; H01L 21/67736; H01L 21/67724
See application file for complete search history.

(56) References Cited

U.S. PATENT DOCUMENTS

| 5,765,703 | A | * | 6/1998 | Shiwaku | ................. | B66C 13/06 |
| | | | | | | 212/274 |
| 9,975,705 | B2 | * | 5/2018 | Kinugawa | ......... | H01L 21/67712 |
| 2017/0152111 | A1 | | 6/2017 | Kinugawa et al. |
| 2020/0346906 | A1 | * | 11/2020 | Mohr | ...................... | B66C 13/06 |

FOREIGN PATENT DOCUMENTS

| JP | 2003118972 A | 4/2003 |
| JP | 201795261 A | 6/2017 |
| JP | 2019185499 A | 10/2019 |

* cited by examiner

*Primary Examiner* — Glenn F Myers
(74) *Attorney, Agent, or Firm* — The Webb Law Firm (57) ABSTRACT

A fixing device that fixes a lower end portion of a suspension belt to a holding portion is provided with a shaft-like portion with an axial direction aligned with a horizontal direction; a fixing portion where the lower end portion of the suspension belt is fixed is provided on an outer circumferential surface of the shaft-like portion; a region of the outer circumferential surface on one side of a virtual vertical surface that runs through an axial center of the shaft-like portion is defined as a first region and a region of the outer circumferential surface on the other side of the virtual vertical surface is defined as a second region; the fixing portion is provided in the first region; and the suspension belt extending from the fixing portion is disposed running through a lowest portion of the outer circumferential surface and running along the second region and upward.

5 Claims, 5 Drawing Sheets

ARTICLE LIFT DEVICE AND ARTICLE TRANSPORT VEHICLE PROVIDED WITH ARTICLE LIFT DEVICE

CROSS-REFERENCE TO RELATED APPLICATION

This application claims priority to Japanese Patent Application No. 2020-172122 filed Oct. 12, 2020, the disclosure of which is hereby incorporated by reference in its entirety.

BACKGROUND OF THE INVENTION

1. Field of the Invention

The present invention relates to an article lift device that raises and lowers an article-holding holding portion with the holding portion being in a suspended state, and an article transport vehicle provided with such an article lift device.

2. Description of the Related Art

An example of such an article lift device is described in JP 2019-185499 (Patent Document 1). The reference signs in brackets used in the description of the related art are those of Patent Document 1.

As illustrated in FIG. 2 of Patent Document 1, the article lift device described in Patent Document 1 is provided with a ceiling transport vehicle (V) that travels on a track (2) provided in a ceiling region. In the article lift device, a holding portion (18a) that holds an article (W) is suspended by a suspension member (18b) constituted by a wire, a belt, or the like. The suspension member (18b) can be wound up or fed out to raise and lower the holding portion (18a). The suspension member (18b) is configured to be wound up or fed out by a lift driving portion (20) located in an upper portion, and the holding portion (18a) is fixed to a lower portion.

SUMMARY OF THE INVENTION

A belt (hereinafter referred to as a suspension belt) is often used as the suspension member (18b). However, such suspension belts may experience deflection or twisting when the stress acting in the extension direction of the suspension belt is non-uniform in the width direction. In particular, if a lower end portion of the suspension belt is not appropriately fixed to the holding portion (18a), a non-uniform stress is likely to act on the suspension belt. On this matter, Patent Document 1 gives no specifics about the structure for fixing together the suspension member (18b) and the holding portion (18a).

In light of the foregoing, there is a need for technology that enables a suspension belt to be appropriately fixed to a holding portion.

An article lift device according to the present disclosure includes:

a holding portion that holds an article;

a lift device that raises and lowers the holding portion with the holding portion being suspended by a suspension belt; and a fixing device that fixes a lower end portion of the suspension belt to the holding portion, wherein the fixing device includes a shaft-like portion with an axial direction aligned with a horizontal direction and a connection portion that connects the shaft-like portion and the holding portion together;

the connection portion connects the shaft-like portion and the holding portion together in a manner so that an outer circumferential surface of the shaft-like portion is separated from the holding portion;

a fixing portion where the lower end portion of the suspension belt is fixed is provided on the outer circumferential surface;

in an axial direction view along the axial direction, a region of the outer circumferential surface on one side of a virtual vertical surface running through an axial center of the shaft-like portion is defined as a first region and a region of the outer circumferential surface on the other side of the virtual vertical surface is defined as a second region;

the fixing portion is provided in the first region; and the suspension belt extending from the fixing portion is disposed running through a lowest portion of the outer circumferential surface and running along the second region and upward.

According to the present configuration, the suspension belt is fixed in the first region of the outer circumferential surface of the shaft-like portion. Also, the suspension belt extending from the fixing portion is disposed running through a lowest portion of the outer circumferential surface and running along the second region and upward. Thus, the tensile load acting on the suspension belt as a result of supporting the weight of the holding portion can press the suspension belt against the lower portion of the outer circumferential surface of the shaft-like portion. Accordingly, the suspension belt can be brought into contact with the outer circumferential surface in the second region from the lowest portion of the outer circumferential surface of the shaft-like portion. Also, the position where the suspension belt extending upward separates from the outer circumferential surface in the second region is easily set at a height at or near the axial center of the shaft-like portion. Thus, according to the present configuration, the suspension belt can be brought into contact with the outer circumferential surface of the shaft-like portion in a relatively large area. Because of this, the contact pressure between the suspension belt and the outer circumferential surface of the shaft-like portion can be made substantially uniform in the width direction of the suspension belt. Thus, according to the present configuration, it is difficult for the stress acting in the extension direction of the suspension belt to be non-uniform in the width direction of the suspension belt, which makes it less likely for the suspension belt to experience deflection or twisting.

Other advantages of the technology according to the present disclosure will be made clear from the description of the exemplary and non-limiting embodiments described below with reference to the drawings.

DETAILED DESCRIPTION OF PREFFERED EMBODIMENTS

An article lift device and an article transport vehicle provided with an article lift device according to an embodiment will now be described using an example of the article transport vehicle being used in an article transport facility.

Figure 1:
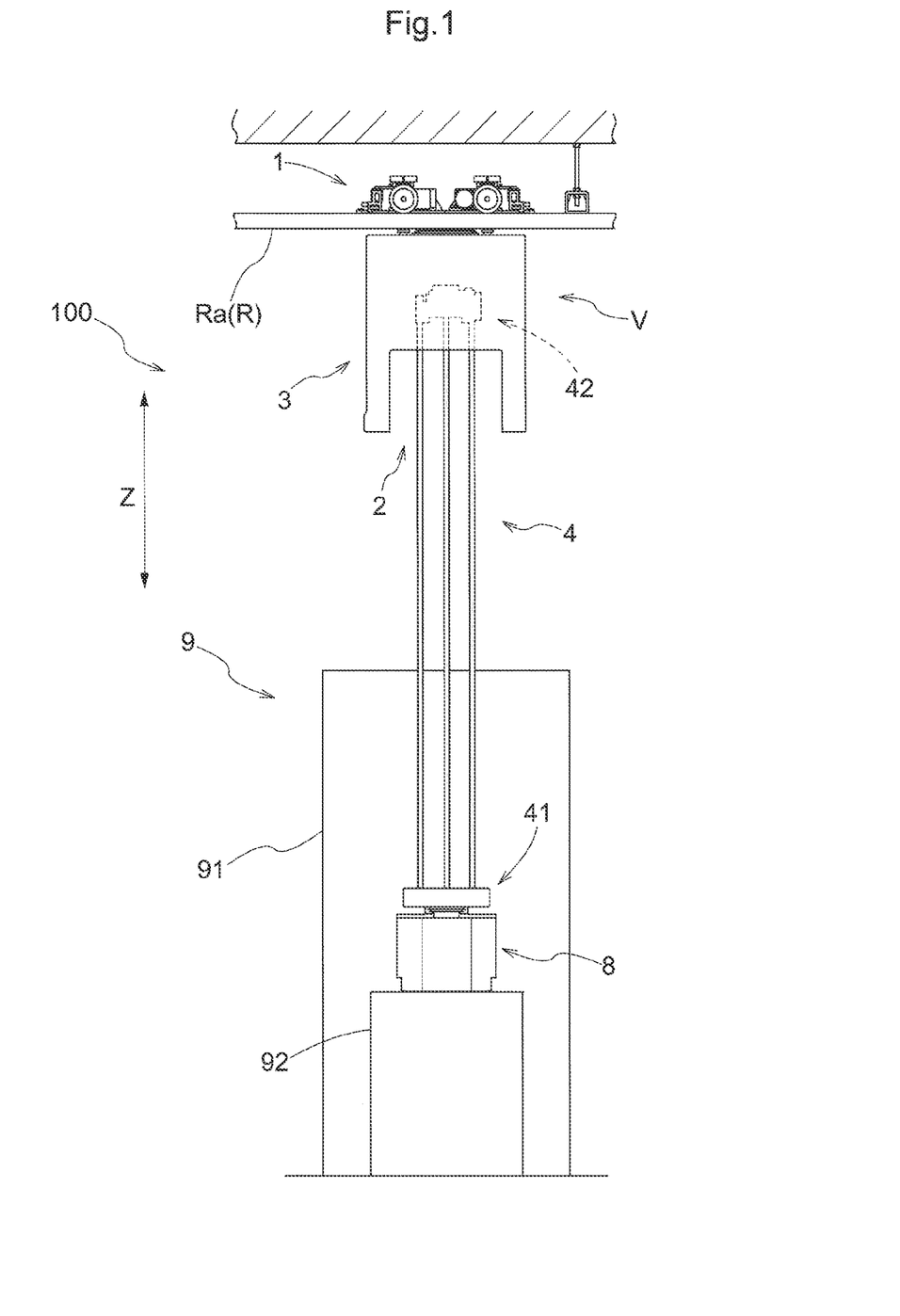
FIG. 1 is a front view illustrating a portion of an article transport facility.
Figure 2:
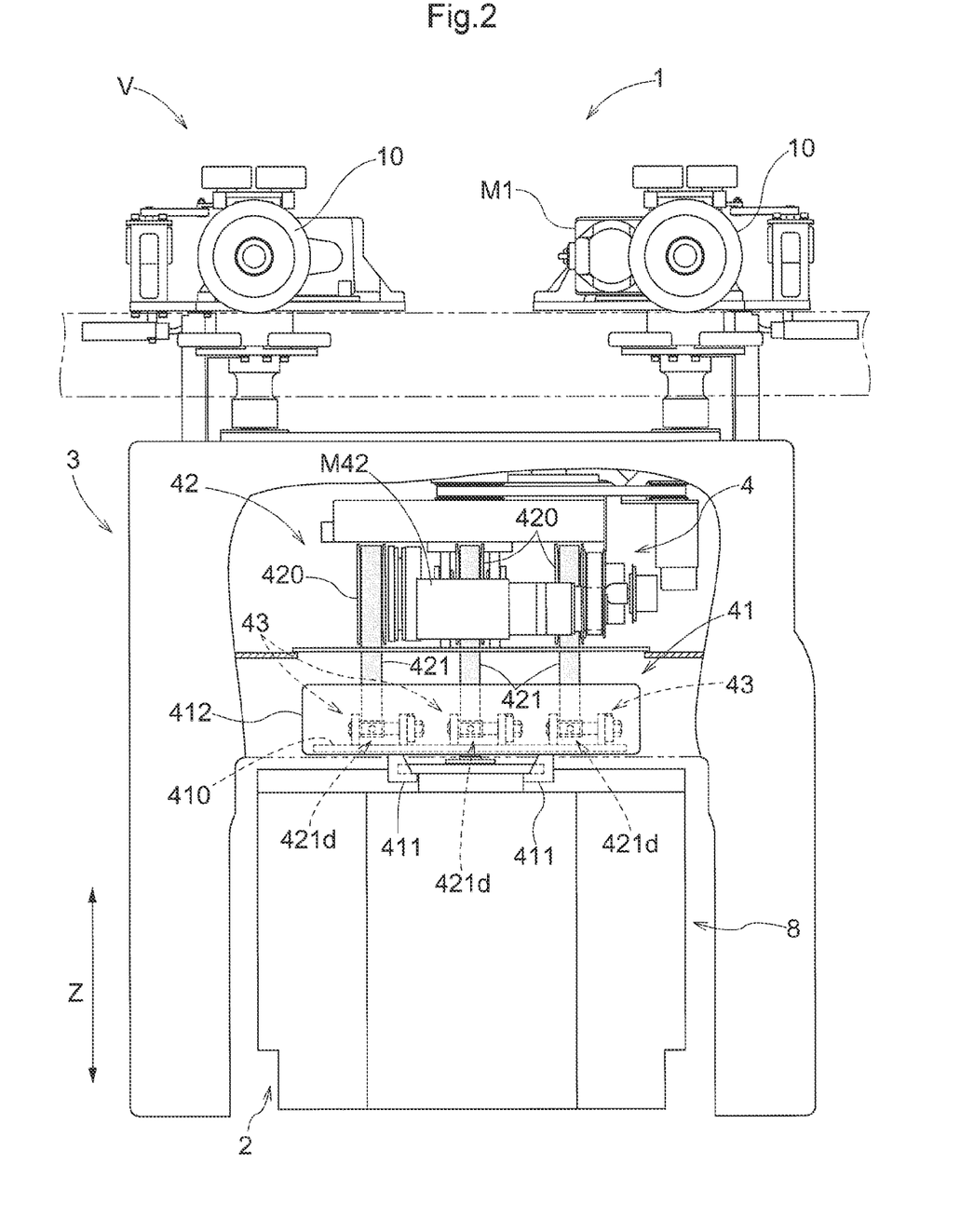
FIG. 2 is a front view illustrating an article transport vehicle provided with an article lift device.

As illustrated in FIGS. 1 and 2, an article transport facility 100 is provided with an article transport vehicle V for transporting an article 8, a rail Ra constituting a travel path R for the article transport vehicle V, and a transfer section 9 where the article 8 is transferred between article transport vehicles V.

A support base 92 that supports the article 8 is provided at the transfer section 9. In the present embodiment, the support base 92 is disposed adjacent to a processing device 91 that processes the article 8. Also, the article transport vehicle V transports the article 8 before it is processed by the processing device 91 from a non-illustrated transportation starting point to the support base 92 and transports the article 8 after it is processed by the processing device 91 from the support base 92 to a non-illustrated transportation destination. In the present embodiment, the article 8 is a container for storing a processing object to be processed by the processing device 91. The phrase "process the article 8" mentioned above means processing of a processing object stored in the article 8. For example, the article 8 may be a front opening unified pod (FOUP), i.e., a wafer storage container for storing wafers, or may be a reticle storage container (i.e., reticle pod) for storing reticles. In a case where the article 8 is a FOUP, the processing object is a wafer. In a case where the article 8 is a reticle pod, the processing object is a reticle. Note that the transfer section 9 is not limited to this configuration, and, for example, the transfer section 9 may be a support base disposed adjacent to a stocker for housing the article 8, a buffer for temporarily holding the article 8, or the like.

The article transport vehicle V is provided with an article lift device 4 that raises and lowers the article 8 and a travel portion 1 that is connected to the article lift device 4 and that travels along a specific travel path R. The article lift device 4 is provided with a holding portion 41 that holds the article 8 and a lift device 42 that raises and lowers the holding portion 41 with the holding portion 41 being suspended by a suspension belt 421. The lift device 42 is provided with the suspension belt 421 that suspends the holding portion 41 and a lift motor M42 that drives the suspension belt 421 and raises and lowers the holding portion 41 between a raised position and a lowered position. Also, the article transport vehicle V is provided with a housing portion 2 that houses the holding portion 41 when the holding portion 41 is at the raised position and a cover 3 that covers the housing portion 2. Note that, at the lowered position, the holding portion 41 is disposed at a height corresponding to the support base 92 of the transfer section 9.

The travel portion 1 is provided with a travel wheel 10 that rolls on the rail Ra and a travel motor M1 that drives the travel wheel 10. In the illustrated example, a plurality of the travel wheels 10 are provided on the article transport vehicle V. The travel motor M1 drives at least one of the plurality of travel wheels 10 and generates a propulsion force to make the article transport vehicle V travel.

The cover 3 is supported in a suspended state by the travel portion 1. In the article transport vehicle V according to the present embodiment, the travel portion 1 is disposed above the rail Ra and the cover 3 is disposed below the rail Ra. In the present example, the cover 3 covers the upper side of the housing portion 2 and both sides of the housing portion 2 in the travel direction of the travel portion 1.

As described above, the article lift device 4 is provided with the holding portion 41 for holding the article 8 and the lift device 42 for raising and lowering the holding portion 41.

Figure 3:
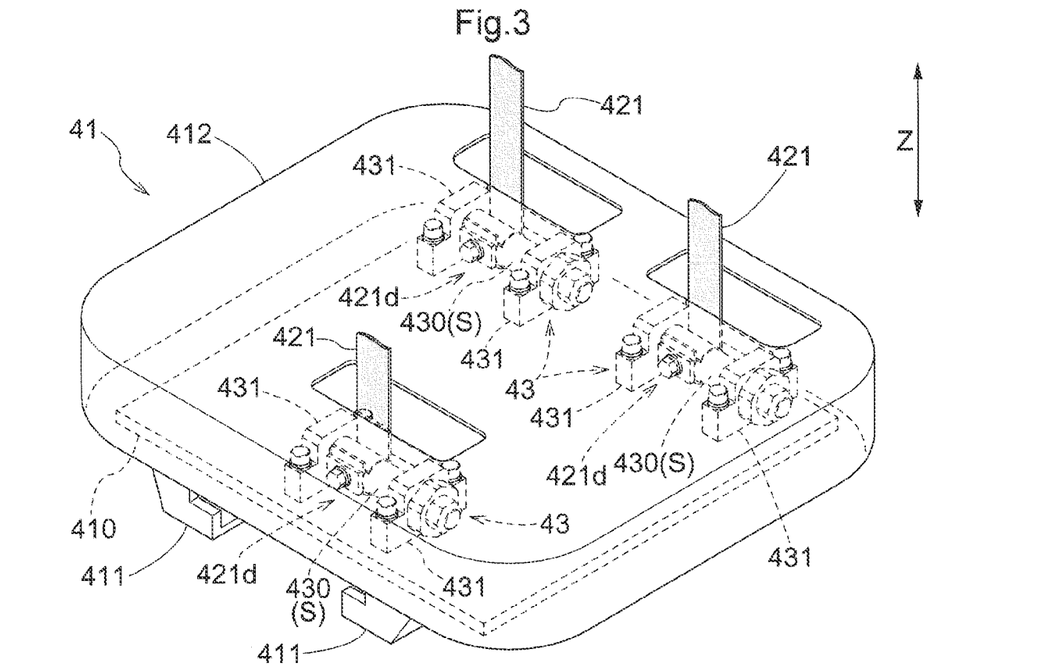
FIG. 3 is a perspective view illustrating a holding portion.

As illustrated in FIGS. 2 and 3, the holding portion 41 is provided with a pair of gripping claws 411 and a gripping motor (not illustrated) that makes the pair of gripping claws 411 come together or separate. Also, the holding portion 41 is configured to switch between a gripping state in which the pair of gripping claws 411 grip the article 8 and a grip release state in which the gripping state is released by the pair of gripping claws 411 being brought together or separated via the driving the gripping motor. In other words, in the present example, the holding portion 41 is configured to hold the article 8 (a flange portion of the FOUP in the illustrated example) by the pair of gripping claws 411 gripping the article 8.

In the present embodiment, the holding portion 41 is provided with a base portion 410 where devices are placed and a casing 412 that covers the devices placed on the base portion 410. The pair of gripping claws 411 are disposed projecting downward through the base portion 410. Note that in FIGS. 2 and 3, various devices, such as a structure and gripping motor that makes the pair of gripping claws 411 come together or separate as described above, are omitted.

As illustrated in FIG. 2, the lift device 42 is provided with a pulley 420, the suspension belt 421 wound around the pulley 420, and the lift motor M42 that rotates the pulley 420 and drives the suspension belt 421. The suspension belt 421 is wound around the pulley 420 at the upper portion and fixed to the holding portion 41 at the lower portion. The lift device 42 rotates the pulley 420 in the forward direction via driving of the lift motor M42 to wind up the suspension belt 421 and raise the holding portion 41 and the article 8 held by the holding portion 41. Also, the lift device 42 rotates the pulley 420 in the reverse direction via driving of the lift motor M42 to feed out the suspension belt 421 and lower the holding portion 41 and the article 8 held by the holding portion 41. By the lift device 42 raising and lowering the article 8 held by the holding portion 41, the article 8 can be transferred between the support bases 92 (transfer sections 9) disposed below the housing portion 2.

Figure 4:
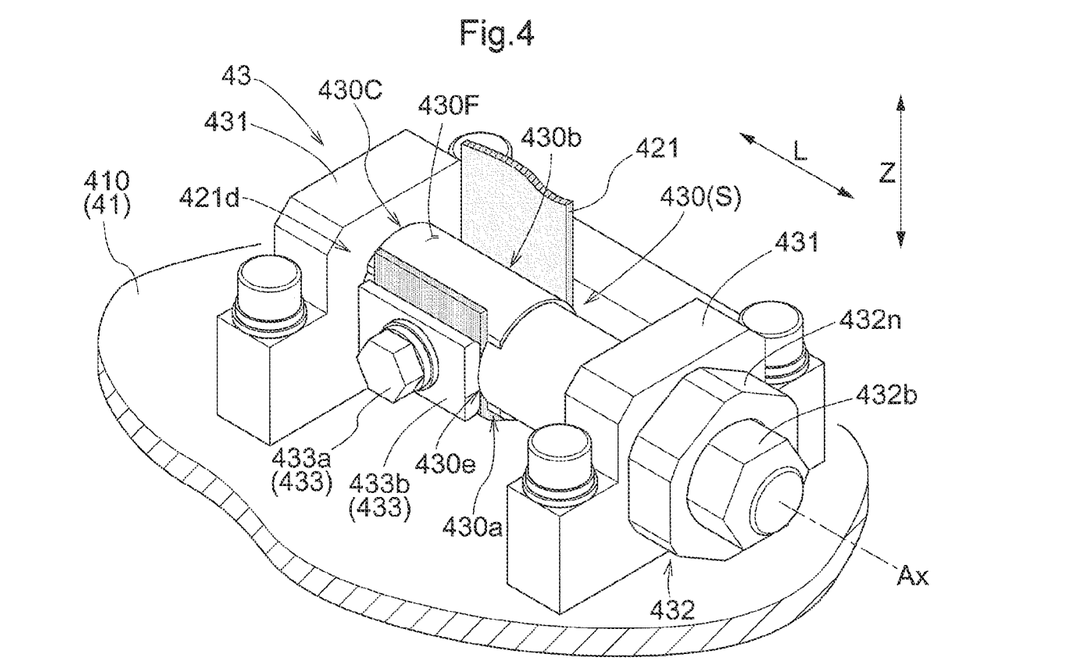
FIG. 4 is a perspective view illustrating a structure for fixing together a holding portion and a suspension belt.

As illustrated in FIGS. 2 to 4, the article lift device 4 is provided with a fixing device 43 for fixing a lower end portion 421d of the suspension belt 421 to the holding portion 41. In the present embodiment, the lower end portion 421d of the suspension belt 421 is fixed to the base portion 410 of the holding portion 41 by the fixing device 43. Note that the lower end portion 421d of the suspension belt 421 indicates the portion of the suspension belt 421 ranging from the lowest end to a certain distance toward the center in the longitudinal direction. In other words, the lower end portion 421d of the suspension belt 421 is not to be interpreted as one point at the lower end of the suspension belt 421. In the present embodiment, the lower end portion 421d includes at least the portion that comes into contact with a shaft-like portion 430, described below, of the fixing device 43.

As illustrated in FIGS. 2 and 3, in the present example, the article lift device 4 is provided with a plurality of units that include the pulley 420, the suspension belt 421, and the fixing device 43. In the illustrated example, the article lift device 4 is provided with three of these units. Each unit has a similar structure, and the positional relationship between the units is set to allow the holding portion 41 to be maintained in a horizontal orientation.

As illustrated in FIGS. 4 to 7, the fixing device 43 is provided with the shaft-like portion 430 with an axial direction L aligned with the horizontal direction and a connection portion 431 that connects the shaft-like portion 430 and the holding portion 41 together. When the holding portion 41 is in an ideal horizontal orientation, the shaft-like portion 430 is disposed with the axial direction L parallel with the horizontal direction. However, the axial direction L of the shaft-like portion 430 being "aligned with the horizontal direction" is not limited to meaning strictly parallel with the horizontal direction and includes in its meaning being roughly parallel with the horizontal direction. In other words, the axial direction L of the shaft-like portion 430 may be a direction that is inclined with respect to the horizontal direction within a specific tolerance range. Here, "inclined within a specific tolerance range" includes in its meaning being inclined due to a manufacturing error. Also, for example, in a case such as where the holding portion 41 is inclined with respect to the horizontal direction, the axial direction L of the shaft-like portion 430 may also be inclined with respect to the horizontal direction, but this inclination is also included within the predetermined tolerance range.

Figure 5:
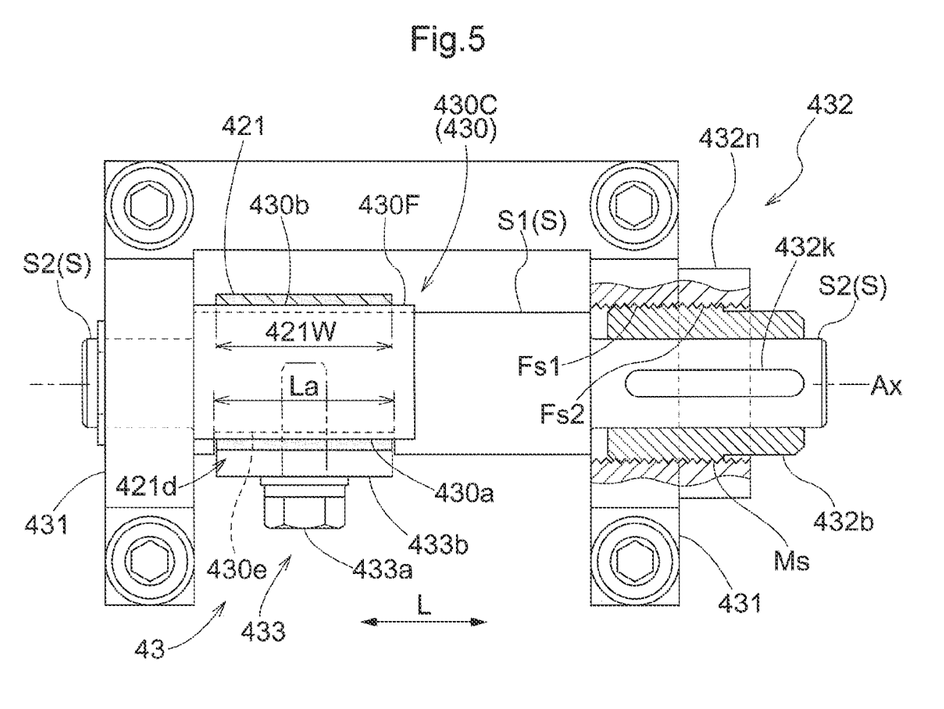
FIG. 5 is a plan view illustrating a structure for fixing together a holding portion and a suspension belt.
Figure 6:
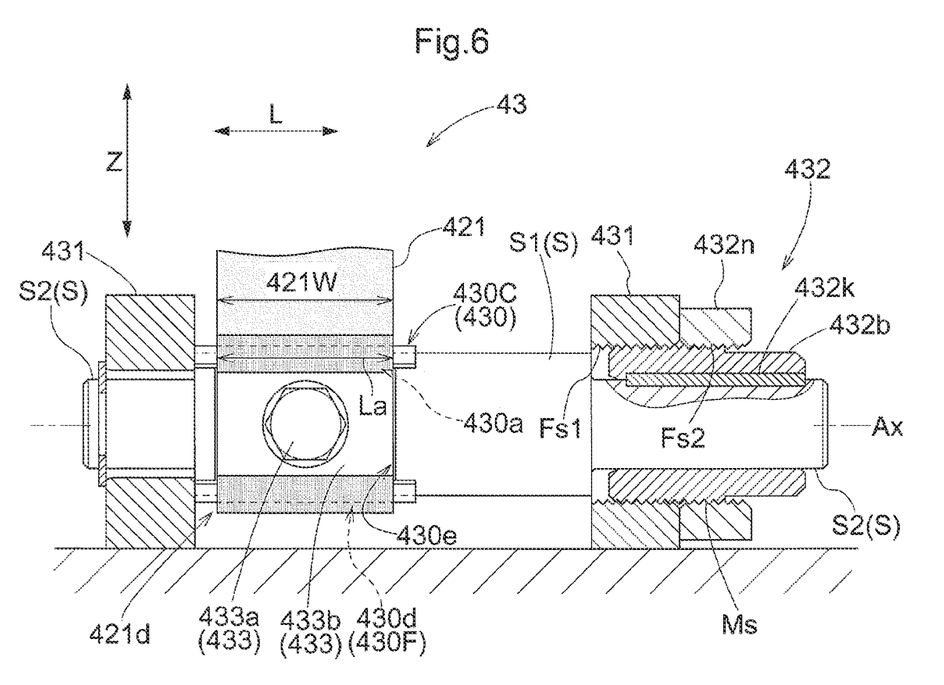
FIG. 6 is a front view illustrating a structure for fixing together a holding portion and a suspension belt.

In the present embodiment, a pair of the connection portions 431 are provided projecting upward from the base portion 410 of the holding portion 41. The two end portions of a shaft S are supported by the pair of connection portions 431. Here, the shaft S is supported with its axis aligned with the horizontal direction. In the present example, the portion of the shaft S disposed between the pair of connection portions 431 corresponds to the shaft-like portion 430.

The connection portions 431 connect the shaft-like portion 430 and the holding portion 41 together in a manner so that an outer circumferential surface 430F of the shaft-like portion 430 is separated from the holding portion 41. In the present embodiment, the pair of connection portions 431 support the shaft-like portion 430 (the shaft S) at a position above and separated from the base portion 410. In this manner, the outer circumferential surface 430F of the shaft-like portion 430 is disposed at a position above and separated from the base portion 410.

Figure 7:
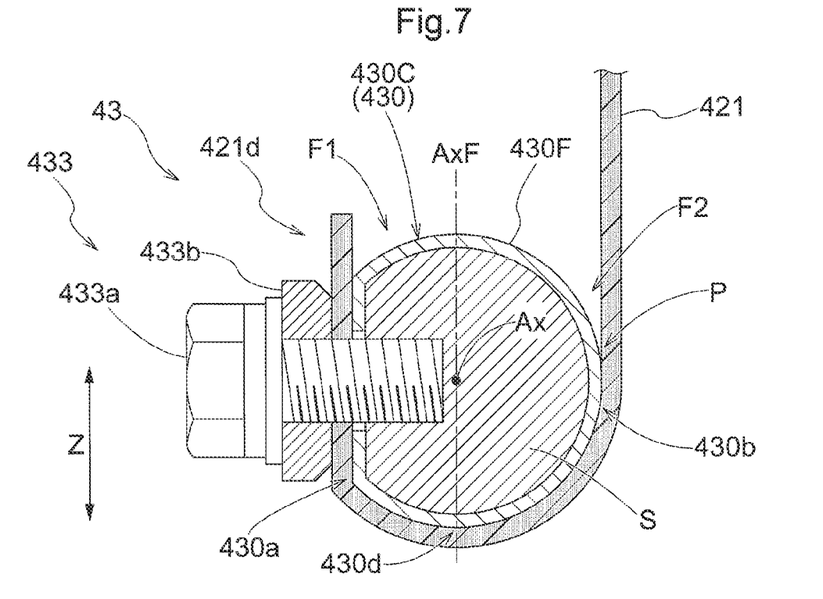
FIG. 7 is a cross-sectional view illustrating a main portion of a fixing device taken along a plane orthogonal to an axial direction.

In the present embodiment, the shaft-like portion 430 is provided with a cover portion 430C. The cover portion 430C is provided covering the outer circumferential surface of the shaft S at a region in the axial direction L of the shaft S. The cover portion 430C is disposed between the shaft S and the suspension belt 421 in the radial direction. As illustrated in FIG. 7, the shape of the cover portion 430C is formed to conform to the outer circumferential surface of the shaft S. In the present embodiment, the outer circumferential surface of the cover portion 430C corresponds to the outer circumferential surface 430F of the shaft-like portion 430.

As illustrated in FIG. 5, in the present embodiment, the shaft-like portion 430 is provided with a positioning portion 430e for positioning the suspension belt 421 in the axial direction L. In the present example, by cutting a region in the axial direction L and the circumferential direction of the cylindrical shaft S into a planar shape, as illustrated in FIG. 4, a step portion is formed on both sides of the planar region in the axial direction L. This step portion corresponds to the positioning portion 430e. Here, the step portion includes a pair of step surfaces facing one another in the axial direction L on either side of the planar region. Also, a region of the extension direction of the suspension belt 421 is disposed between these pairs of step surfaces. In this manner, the suspension belt 421 is disposed sandwiched by the pair of step surfaces in the axial direction L. This allows the suspension belt 421 to be positioned in the axial direction L with respect to the shaft-like portion 430.

Here, as illustrated in FIG. 7, when viewing the outer circumferential surface 430F of the shaft-like portion 430 in the axial direction L along the axial direction L, the region of the outer circumferential surface 430F on one side of an axial center Ax of the shaft-like portion 430 in the horizontal direction is defined as a first region F1 and the other region in the horizontal direction is defined as a second region F2. In other words, in a case where the outer circumferential surface 430F is divided along a virtual vertical surface AxF running through the axial center Ax of the shaft-like portion 430, one of the divided regions is the first region F1 and the other divided region is the second region F2.

A fixing portion 430a where the lower end portion 421d of the suspension belt 421 is fixed is provided on the outer circumferential surface 430F. The fixing portion 430a is provided in the first region F1. Also, the suspension belt 421 extending from the fixing portion 430a is disposed running through a lowest portion 430d of the outer circumferential surface 430F and running along the second region F2 and upward. In the present embodiment, a guide portion 430b for guiding the suspension belt 421 to the pulley 420 (see FIG. 2 and the like) side is provided in the second region F2 of the outer circumferential surface 430F. In other words, in the present embodiment, the fixing portion 430a is provided on one side (the first region F1) of the virtual vertical surface AxF of the outer circumferential surface 430F and the guide portion 430b is provided on the other side (the second region F2). In the present example, the guide portion 430b corresponds to the surface of the outer circumferential surface 430F is the second region F2.

As illustrated in FIG. 6, in the present embodiment, the fixing portion 430a is formed in a planar shape with a dimension (referred to as an axial direction dimension La) in the axial direction L equal to or greater than a belt width 421W of the suspension belt 421 (see also FIG. 7). Thus, because the fixing portion 430a and the suspension belt 421 are brought into contact flat against one another, the suspension belt 421 can be easily fixed at the fixing portion 430a appropriately. In the illustrated example, the belt width 421W and the axial direction dimension La of the fixing portion 430a are substantially the same size. Also, in the present example, the planar region forming the fixing portion 430a is the same as the planar region for forming the pair of step surfaces forming the positioning portion 430e described above.

As illustrated in FIG. 7, in the present embodiment, the portion of the outer circumferential surface 430F other than the fixing portion 430a is formed in a cylindrical surface shape. In the present example, a portion of the first region F1 of the outer circumferential surface 430F corresponds to the fixing portion 430a formed in a planar shape. In other words, the first region F1 of the outer circumferential surface 430F includes a planar portion and a cylindrical surface portion. Also, the lowest portion 430d and the second region F2 (the guide portion 430b) of the outer circumferential surface 430F are formed in a cylindrical surface shape continuous with one another. In the present embodiment, the outer circumferential surface 430F of the shaft-like portion 430, i.e., the outer circumferential surface 430F of the cover portion 430C in this example, is formed with a portion of the cylindrical surface flattened and the external shape of the cross-section orthogonal to the axial direction L formed in a D shape.

In the present embodiment, the suspension belt 421 is fastened to the fixing portion 430a of the outer circumferential surface 430F by a fastening member 433. The fastening member 433 is provided with a bolt 433a screwed into the shaft-like portion 430 (the shaft S) from the radially outward side while extending through the suspension belt 421 in the thickness direction and a pressing plate 433b disposed between the head of the bolt 433a and the suspension belt 421. A female thread into which the bolt 433a is screwed is formed in the section corresponding to the shaft-like portion 430 (the shaft 5). The pressing plate 433b presses the suspension belt 421 against the fixing portion 430a (the shaft-like portion 430) from the radially outward side as the bolt 433a is screwed into the shaft-like portion 430. In other words, the suspension belt 421 is sandwiched between the pressing plate 433b and the fixing portion 430a in the radial direction and fixed. In the present example, the pressing plate 433b has a dimension in the axial direction L that corresponds to the axial direction dimension La of the fixing portion 430a and the belt width 421W of the suspension belt 421 (see FIGS. 5 and 6). Accordingly, at the fixing portion 430a of the outer circumferential surface 430F, the contact pressure between the suspension belt 421 and the outer circumferential surface 430F of the shaft-like portion 430 can be easily made uniform in the width direction of the suspension belt 421.

As illustrated in FIG. 7, in the present embodiment, the fixing portion 430a is disposed including a portion at the same height as the axial center Ax of the shaft-like portion 430. In other words, the fixing portion 430a is disposed intersecting a virtual horizontal plane including the axial center Ax of the shaft-like portion 430. In this manner, the fixing portion 430a can be disposed at a position relatively far from the lowest portion 430d of the outer circumferential surface 430F of the shaft-like portion 430. This allows a large contact area between the outer circumferential surface 430F and the suspension belt 421 at the lowest portion 430d region to be ensured, which makes the contact pressure between the suspension belt 421 and the outer circumferential surface 430F easy to make uniform in the width direction of the suspension belt 421.

Also, in FIGS. 4 to 6, in the present embodiment, the fixing device 43 is provided with a position changing portion 432 that rotates the shaft-like portion 430 about the axial center Ax to change the position of the fixing portion 430a in the circumferential direction of the shaft-like portion 430. By operating the position changing portion 432 in this manner, the position of the fixing portion 430a in the circumferential direction of the shaft-like portion 430 can be adjusted. Accordingly, the portion of the suspension belt 421 extending from the fixing portion 430a can be easily adjusted to a state of being uniform with the outer circumferential surface 430F of the shaft-like portion 430.

As illustrated in FIGS. 5 and 6, in the present embodiment, the position changing portion 432 is configured with a so-called double nut configuration. To explain further, the shaft S is provided with a large diameter portion S1 disposed between the pair of connection portions 431 and a small diameter portion S2 formed with a smaller diameter than the large diameter portion S1 disposed on each side of the large diameter portion S1 in the axial direction L. Also, a cylindrical bolt 432b is disposed covering the outer circumference of the small diameter portion S2, and the small diameter portion S2 and the cylindrical bolt 432b engage in the circumferential direction via a key 432k and integrally rotate. Also, the cylindrical bolt 432b is configured to be able to move in the axial direction L relative to the small diameter portion S2. A first female thread portion Fs1 that engages with a male thread portion Ms of the cylindrical bolt 432b is formed at a portion of the connection portion 431 where the small diameter portion S2 (the shaft S) extends through. Also, a nut 432n is disposed adjacent to the connection portion 431 in the axial direction L. A second female thread portion Fs2 that engages with the male thread portion Ms of the cylindrical bolt 432b is formed in the inner circumferential surface of the nut 432n.

In this manner, the cylindrical bolt 432b is restricted from moving in the circumferential direction relative to the small diameter portion S2 but can move in the axial direction L. Thus, even with the cylindrical bolt 432b and the first female thread portion Fs1 engaged together, by moving the position in the axial direction L of the cylindrical bolt 432b relative to the small diameter portion S2, the shaft S can be rotated without moving the position in the axial direction L of the large diameter portion S1 relative to the connection portion 431. Accordingly, with the nut 432n loosened, the shaft-like portion 430 can be rotated about the axial center Ax to change the position of the fixing portion 430a in the circumferential direction. Also, by tightening the nut 432n, the shaft S can be prevented from rotating.

Figure 8:
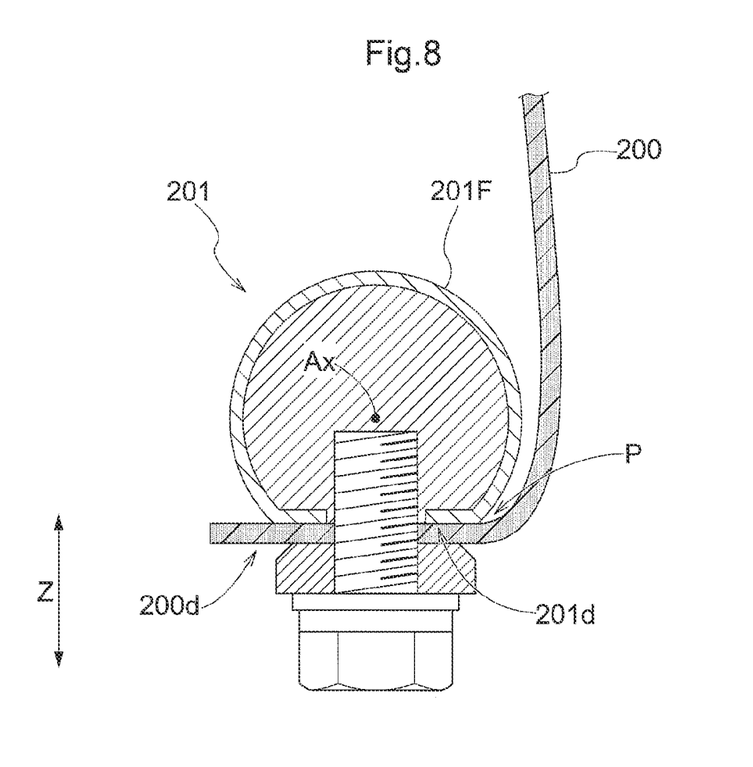
FIG. 8 is a cross-sectional view illustrating a fixing structure of a suspension belt according to a comparative example.

Here, a comparative example of the present configuration is illustrated in FIG. 8. In the configuration of the comparative example, the fixing position of a lower end portion 200d of a suspension belt 200 corresponds to a lowest portion 201d of a shaft-like portion 201. As illustrated in FIG. 8, with such a configuration, due to the rigidity or other characteristic of the suspension belt 200, the suspension belt 200 may extend not conforming to an outer circumferential surface 201F and being separated from the outer circumferential surface 201F. In other words, compared to the present configuration illustrated in FIG. 7, in the comparative example illustrated in FIG. 8, the position (referred to as a separation position P) where the suspension belt 200 separates from the outer circumferential surface 201F is at or near the lowest portion 201d of the outer circumferential surface 201F, and thus the area where the suspension belt 200 comes into contact with the outer circumferential surface 201F of the shaft-like portion 201 is small. Accordingly, in the comparative example, the suspension belt 200 cannot be disposed conforming to the outer circumferential surface 201F of the shaft-like portion 201, and the suspension belt 200 cannot be appropriately fixed. Thus, stress acting in the extension direction of the suspension belt 200 is likely to act in a non-uniform manner in the width direction of the suspension belt 200, causing deflection or twisting in the suspension belt 200.

However, in the present configuration, as illustrated in FIG. 7, the suspension belt 421 is fixed in the first region F1 of the outer circumferential surface 430F of the shaft-like portion 430. Also, the suspension belt 421 extending from the fixing portion 430a is disposed running through a lowest portion 430d of the outer circumferential surface 430F and running along the second region F2 and upward. Accordingly, the suspension belt 421 can be brought into contact with the outer circumferential surface 430F in the second region F2 from the lowest portion 430d of the outer circumferential surface 430F of the shaft-like portion 430. Also, the separation position P where the suspension belt 421 extending upward separates from the outer circumferential surface 430F in the second region F2 is easily set at a height at or near the axial center Ax of the shaft-like portion 430. Accordingly, the suspension belt 421 can be brought into contact with the outer circumferential surface 430F of the shaft-like portion 430 in a relatively large area. Because of this, the contact pressure between the suspension belt 421 and the outer circumferential surface 430F of the shaft-like portion 430 can be made substantially uniform in the width direction of the suspension belt 421. This makes it difficult for the stress acting in the extension direction of the suspension belt 421 to be non-uniform in the width direction of the suspension belt 421, which makes it less likely for the suspension belt 421 to experience deflection or twisting. Accordingly, the width direction of the suspension belt 421 can be easily aligned with the horizontal direction, or in other words, the extension direction of the suspension belt 421 can be easily aligned with the vertical direction. This makes it easy to adjust the length of the suspension belt 421. As in the present example, with a configuration in which the holding portion 41 is suspended by a plurality (three) of the suspension belts 421, the length of each one of the plurality of suspension belts 421 can be easily adjusted. This also makes it easy to adjust the levelness of the suspended holding portion 41.

Other Embodiments

Next, an article lift device according to other embodiments will be described.

1. In the embodiment described above, the fixing portion 430a is formed in a planar shape. However, the fixing portion 430a is not limited to this example and may be formed in a cylindrical surface shape, for example. In this case, all of the outer circumferential surface 430F including the first region F1 and the second region F2 may be formed in a cylindrical surface shape.

2. In the embodiment described above, the outer circumferential surface 430F of the shaft-like portion 430 is formed with a portion of the cylindrical surface flattened and the external shape of the cross-section orthogonal to the axial direction L formed in a D shape. However, the external shape is not limited to this example, and the external shape of the cross-section orthogonal to the axial direction L of the outer circumferential surface 430F may be formed in a circular shape, an elliptical shape, a polygonal shape, or the like. Note that in a case where the external shape of the cross-section orthogonal to the axial direction L of the outer circumferential surface 430F is a polygonal shape, a polygonal shape with many corners resembling a circular shape is preferable.

3. In the embodiment described above, the fixing portion 430a is disposed including a portion at the same height as the axial center Ax of the shaft-like portion 430. However, the fixing portion 430a is not limited to this example, and the fixing portion 430a is only required to be disposed in the first region F1 of the outer circumferential surface 430F and may not include a portion at the same height as the axial center Ax of the shaft-like portion 430. In this case, the fixing portion 430a, in the first region F1, is preferably disposed at a position higher than the axial center Ax of the shaft-like portion 430, but may be disposed at a position lower than the axial center Ax.

4. In the embodiment described above, the shaft-like portion 430 is provided with the cover portion 430C, and the outer circumferential surface of the cover portion 430C corresponds to the outer circumferential surface 430F of the shaft-like portion 430. However, the shaft-like portion 430 is not limited to this example and may not be provided with the cover portion 430C. In this case, the outer circumferential surface of the portion of the shaft S corresponding to the shaft-like portion 430 corresponds to the outer circumferential surface 430F of the shaft-like portion 430.

5. In the embodiment described above, the fixing device 43 is provided with a position changing portion 432 that rotates the shaft-like portion 430 about the axial center Ax to change the position of the fixing portion 430a in the circumferential direction of the shaft-like portion 430. However, the fixing device 43 is not limited to this example and may not be provided with the position changing portion 432.

6. In the embodiment described above, the article lift device 4 is provided on the article transport vehicle V. However, the article lift device 4 described above can be used in various devices for raising and lowering the article 8 and is not limited to being used in the article transport vehicle V. The article lift device 4 can be used in a lifter for raising and lowering transportation, for example.

7. Note that the configurations described in the embodiments described above can be used in combination with configurations described in other embodiments as long as inconsistencies are avoided. Also, regarding the other configurations, the embodiments described in the present specification are merely examples in all aspects. Accordingly, various modifications within the range of the present disclosure can be made as appropriate.

Supplement

The article lift device and the article transport vehicle described above will be described below.

An article lift device according to the present disclosure includes:

a holding portion that holds an article;

a lift device that raises and lowers the holding portion with the holding portion being suspended by a suspension belt; and a fixing device that fixes a lower end portion of the suspension belt to the holding portion, wherein the fixing device includes a shaft-like portion with an axial direction aligned with a horizontal direction and a connection portion that connects the shaft-like portion and the holding portion together;

the connection portion connects the shaft-like portion and the holding portion together in a manner so that an outer circumferential surface of the shaft-like portion is separated from the holding portion;

a fixing portion where the lower end portion of the suspension belt is fixed is provided on the outer circumferential surface;

in an axial direction view along the axial direction, a region of the outer circumferential surface on one side of a virtual vertical surface running through an axial center of the shaft-like portion is defined as a first region and a region of the outer circumferential surface on the other side of the virtual vertical surface is defined as a second region;

the fixing portion is provided in the first region; and the suspension belt extending from the fixing portion is disposed running through a lowest portion of the outer circumferential surface and running along the second region and upward.

According to the present configuration, the suspension belt is fixed in the first region of the outer circumferential surface of the shaft-like portion. Also, the suspension belt extending from the fixing portion is disposed running through the lowest portion of the outer circumferential surface and running along the second region and upward. Thus, the tensile load acting on the suspension belt as a result of supporting the weight of the holding portion can press the suspension belt against the lower portion of the outer circumferential surface of the shaft-like portion. Accordingly, the suspension belt can be brought into contact with the outer circumferential surface in the second region from the lowest portion of the outer circumferential surface of the shaft-like portion. Also, the position where the suspension belt extending upward separates from the outer circumferential surface in the second region is easily set at a height at or near the axial center of the shaft-like portion. Thus, according to the present configuration, the suspension belt can be brought into contact with the outer circumferential surface of the shaft-like portion in a relatively large area. Because of this, the contact pressure between the suspension belt and the outer circumferential surface of the shaft-like portion can be made substantially uniform in the width direction of the suspension belt. Thus, according to the present configuration, it is difficult for the stress acting in the extension direction of the suspension belt to be non-uniform in the width direction of the suspension belt, which makes it less likely for the suspension belt to experience deflection or twisting.

Preferably, the fixing portion is formed in a planar shape with a dimension in the axial direction equal to or greater than a belt width of the suspension belt; and a portion of the outer circumferential surface other than the fixing portion is formed in a cylindrical surface shape.

According to the present configuration, because the fixing portion and the suspension belt can be brought into contact flat against one another, the suspension belt can be easily fixed at the fixing portion appropriately. Also, because the portion of the outer circumferential surface other than the fixing portion is formed in a cylindrical surface shape, the suspension belt extending from the fixing portion is easily disposed in a uniform state with the outer circumferential surface. Thus, the contact pressure between the suspension belt and the outer circumferential surface of the shaft-like portion is easier to be made substantially uniform.

Also, preferably, the fixing portion is disposed including a portion at the same height as the axial center.

According to the present configuration, the fixing portion can be disposed at a position relatively far from the lowest portion of the outer circumferential surface of the shaft-like portion. This allows a large contact area between the outer circumferential surface of the shaft-like portion and the suspension belt at the lowest portion region to be ensured, which makes the contact pressure between the suspension belt and the outer circumferential surface of the shaft-like portion easy to approximate uniform in the width direction of the suspension belt. Accordingly, the suspension belt is even less likely to experience deflection and twisting.

Also, preferably, the fixing device is provided with a position changing portion that rotates the shaft-like portion about the axial center and changes a position of the fixing portion in a circumferential direction of the shaft-like portion.

According to the present configuration, by operating the position changing portion in this manner, the position of the fixing portion in the circumferential direction of the shaft-like portion can be adjusted. Accordingly, the portion of the suspension belt extending from the fixing portion can be easily made in a uniform state with the outer circumferential surface of the shaft-like portion.

An article transport vehicle according to the present disclosure includes:

the article lift device according to the configuration described above;

a travel portion connected to the article lift device that travels along a specific travel path; and a housing portion that houses the holding portion when the holding portion is at a raised position.

According to the present configuration, the article lift device can be suitably used in an article transport vehicle for transferring an article via raising and lowering.

INDUSTRIAL APPLICABILITY

The technology according to the present disclosure can be applied to an article lift device that raises and lowers an article-holding holding portion with the holding portion being in a suspended state, and an article transport vehicle provided with such an article lift device.

REFERENCE SIGNS LIST

V Article transport vehicle
1 Travel portion
2 Housing portion
4 Article lift device
41 Holding portion
42 Lift device
43 Fixing device
421 Suspension belt
421W Belt width
421d Lower end portion
430 Shaft-like portion
430F Outer circumferential surface
F1 First region
F2 Second region
430a Fixing portion
430d Lowest portion
431 Connection portion
432 Position changing portion
8 Article
R Travel path
Ax Axial center
L Axial direction
La Axial direction dimension

What is claimed is:

1. An article lift device, comprising:
a holding portion that holds an article;
a lift device that raises and lowers the holding portion with the holding portion being suspended by a suspension belt; and
a fixing device that fixes a lower end portion of the suspension belt to the holding portion, wherein:
the fixing device comprises a shaft-like portion with an axial direction aligned with a horizontal direction and a connection portion that connects the shaft-like portion and the holding portion together;
the connection portion connects the shaft-like portion and the holding portion together in a manner so that an outer circumferential surface of the shaft-like portion is separated from the holding portion;
a fixing portion, where the lower end portion of the suspension belt is fixed, is provided on the outer circumferential surface;
in an axial direction view along the axial direction, a region of the outer circumferential surface on one side of a virtual vertical surface running through an axial center of the shaft-like portion is a first region and a region of the outer circumferential surface on the other side of the virtual vertical surface is a second region;
the fixing portion is provided in the first region; and
the suspension belt extending from the fixing portion is disposed running through a lowest portion of the outer circumferential surface and running along the second region and upward.

2. The article lift device according to claim 1, wherein:
the fixing portion is formed in a planar shape with a dimension in the axial direction equal to or greater than a belt width of the suspension belt; and
a portion of the outer circumferential surface other than the fixing portion is formed in a cylindrical surface shape.

3. The article lift device according to claim 1, wherein:
the fixing portion is disposed including a portion at the same height as the axial center.

4. The article lift device according to claim 1, wherein:
the fixing device is provided with a position changing portion that rotates the shaft-like portion about the axial center and changes a position of the fixing portion in a circumferential direction of the shaft-like portion.

5. An article transport vehicle, comprising:
the article lift device according to claim 1;
a travel portion connected to the article lift device that travels along a specific travel path; and
a housing portion that houses the holding portion when the holding portion is at a raised position.

\* \* \* \* \*